(12) United States Patent
Ibe et al.

(10) Patent No.: US 9,914,993 B2
(45) Date of Patent: Mar. 13, 2018

(54) THERMAL SPRAY POWDER

(71) Applicant: FUJIMI INCORPORATED, Kiyosu-shi, Aichi (JP)

(72) Inventors: Hiroyuki Ibe, Kiyosu (JP); Kazuyuki Tsuzuki, Kiyosu (JP)

(73) Assignee: FUJIMI INCORPORATED, Kiyosu-Shi (JP)

( * ) Notice: Subject to any disclaimer, the term of this patent is extended or adjusted under 35 U.S.C. 154(b) by 0 days.

(21) Appl. No.: 15/050,923

(22) Filed: Feb. 23, 2016

(65) Prior Publication Data
US 2016/0244868 A1 Aug. 25, 2016

(30) Foreign Application Priority Data

Feb. 24, 2015 (JP) .................. 2015-034086

(51) Int. Cl.
| | |
|---|---|
| C04B 35/622 | (2006.01) |
| C23C 4/04 | (2006.01) |
| H01J 37/32 | (2006.01) |
| C04B 35/111 | (2006.01) |
| C04B 35/505 | (2006.01) |
| C04B 35/515 | (2006.01) |
| C04B 35/553 | (2006.01) |

(52) U.S. Cl.
CPC ............ *C23C 4/04* (2013.01); *C04B 35/111* (2013.01); *C04B 35/505* (2013.01); *C04B 35/5152* (2013.01); *C04B 35/553* (2013.01); *C04B 35/62222* (2013.01); *H01J 37/3288* (2013.01); *H01J 37/32477* (2013.01); *H01J 37/32495* (2013.01); *C04B 2235/5436* (2013.01); *C04B 2235/77* (2013.01); *C04B 2235/96* (2013.01)

(58) Field of Classification Search
None
See application file for complete search history.

(56) References Cited

U.S. PATENT DOCUMENTS

| | | | |
|---|---|---|---|
| 2002/0018902 A1 | 2/2002 | Tsukatani et al. | |
| 2002/0160189 A1 | 10/2002 | Wataya et al. | |
| 2003/0225293 A1* | 12/2003 | Grey | C07D 301/12 549/531 |
| 2006/0182969 A1 | 8/2006 | Kitamura et al. | |
| 2009/0062557 A1* | 3/2009 | Gueckel | B01J 23/688 549/536 |

FOREIGN PATENT DOCUMENTS

| | | |
|---|---|---|
| JP | 2002-302754 A | 10/2002 |
| JP | 2002-363724 A | 12/2002 |
| JP | 2006-225689 A | 8/2006 |

* cited by examiner

*Primary Examiner* — Colin W. Slifka
(74) *Attorney, Agent, or Firm* — Foley & Lardner LLP

(57) ABSTRACT

Provided is a compact thermal spray powder suitable for forming a ceramic thermal spray coating which is compact and excels in durability. The thermal spray powder disclosed herein includes ceramic particles formed of a ceramic material with a melting point equal to or lower than 2000° C. The thermal spray powder is configured such that the peak top of a main peak is in a range of 10 μm or less in a log differential pore volume distribution obtained by a mercury porosimetry, and when the peak top of a second peak is at a fine pore size less than that of the peak top of the main peak, the ratio (H2/H1) of the height H2 of the second peak to the height H1 of the main peak is 0.05 or less.

3 Claims, 1 Drawing Sheet

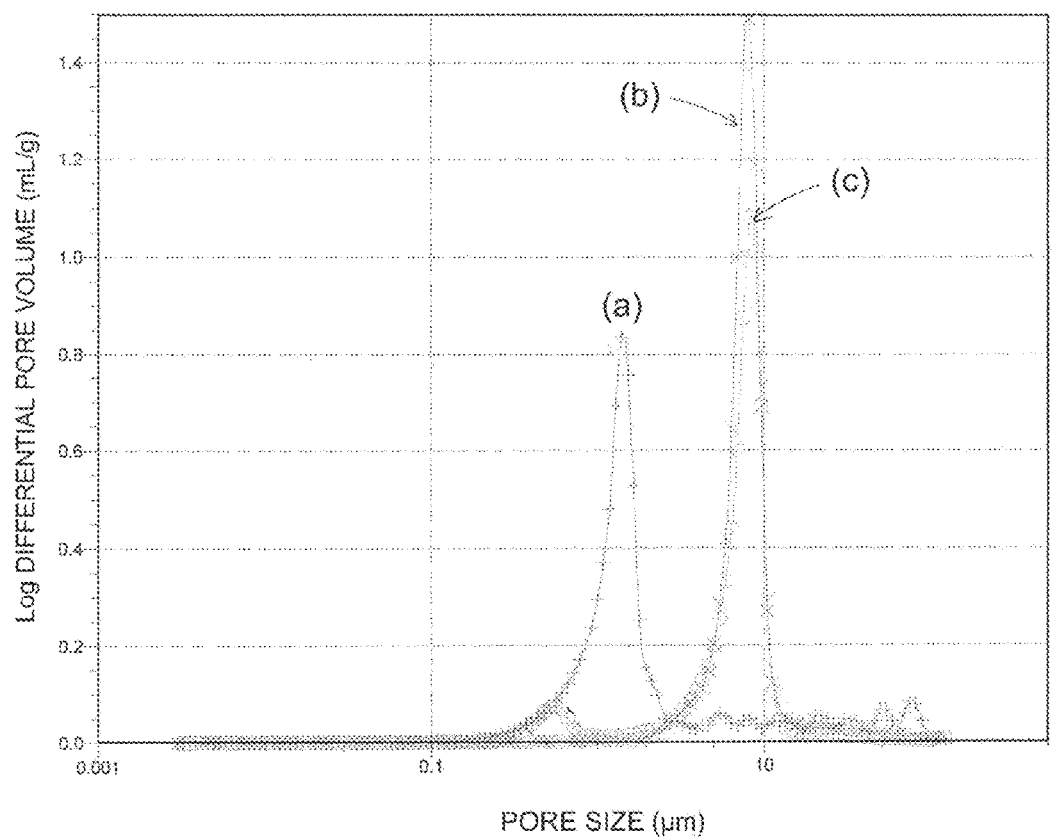

THERMAL SPRAY POWDER

CROSS-REFERENCE

The present application claims priority to Japanese Patent Application No. 2015-034086, filed on Feb. 24, 2015, the entire contents of which are hereby incorporated by reference.

BACKGROUND OF THE INVENTION

1. Field of the Invention

The present invention relates to a thermal spray powder including ceramic particles.

2. Description of the Related Art

In the field of fabrication of semiconductor devices or the like, the surface of a semiconductor substrate is generally subjected to fine processing by dry etching using plasma of a halogen gas such as fluorine, chlorine, and bromine. After the dry etching, the interior of the chamber from which the semiconductor substrate has been removed is cleaned using oxygen gas plasma. At this time, parts inside the chamber which are exposed to highly reactive oxygen gas plasma or halogen gas plasma can be eroded. Where the eroded portions fall off in the form of particles from the parts, the particles can become a foreign matter (the foreign matter is referred to hereinbelow as "particulate") that adheres to the semiconductor substrate and causes circuit defects.

Therefore, in order to reduce the occurrence of the particulate in the semiconductor device production apparatuses, the parts exposed to plasma of oxygen gas or halogen gas have been conventionally provided with thermal spray coatings of ceramic materials having high resistance to plasma erosion. For example, Japanese Patent Application Publication (JP-A) No. 2002-363724 indicates that a thermal spray coating with resistance to plasma-induced erosion can be formed using granules, which include yttrium oxyfluoride in at least part thereof, as a thermal spray material. The conventional techniques relating to thermal spray materials formed of ceramics are described, for example, in JP-A No. 2002-363724, 2002-302754, and 2006-225689.

SUMMARY OF THE INVENTION

JP-A No. 2002-363724 and 2002-302754 indicate that when a thermal spray coating is formed, it is desirable that the thermal spray particles be completely melted during thermal spraying, and it is indicated that thermal spray particles can be completely melted during thermal spraying (JP-A No. 2002-363724) and that thermal spray particles are completely melted during thermal spraying (JP-A No. 2002-302754). However, even with the thermal spray coating formed by using such conventional thermal spray particles, when the coating is used over a long period of time, the erosion induced by erosive plasma is advanced. Therefore, further improvement in resistance to plasma erosion is needed.

The present invention has been created with the foregoing in view, and it is an objective thereof to provide a thermal spray powder capable of forming a ceramic thermal spray coating of increased compactness and excellent durability such as resistance to plasma erosion.

The inventors have established that, for example, when a thermal spray coating is formed by thermally spraying the thermal spray particles disclosed in JP-A No. 2002-363724 and 2002-302754, although some of the thermal spray particles are completely melted, not all of the thermal spray particles which are to form the thermal spray coating are completely melted, and some thermal spray particles remain in the unmelted state (also referred to as unmelted particles). Thermal spray particles obtained by a granulation and sintering method include an especially large number of pores in the granules. Therefore, where the cross-section of particles flying during thermal spraying is observed, the granule surface is melted, but a large number of unmelted thermal spray particles are scattered inside the granules. Indeed, the observations of the cross-sectional structure of the thermal spray coating also reveal several unmelted thermal spray particles in the coating structure and suggest that the particles which have not been melted during thermal spraying remain in the coating. The inventors have found that where such unmelted particles are present, even in a very small number, in the thermal spray coating, pores easily appear between the stacked particles and those pores cause the formation of through pores reaching from the coating surface to the base material. The through pores initiate rapid degradation of plasma erosion resistance characteristic and can rapidly increase the amount of generated particulate.

Accordingly, in order to attain the abovementioned objective, the present invention provides a thermal spray powder including ceramic particles formed of a ceramic material with a melting point equal to or lower than 2000° C. The specific feature of the thermal spray powder is that the peak top of a main peak is in a range of 10 μm or less in a log differential pore volume distribution obtained by a mercury porosimetry (or a mercury porosimetry method), and when the peak top of a second peak is at a fine pore size less than that of the peak top of the main peak, the ratio (H2/H1) of the height H2 of the second peak to the height H1 of the main peak is 0.05 or less.

As mentioned hereinabove, the thermal spray powder is constituted by a ceramic material with a comparatively low melting point. Further, as mentioned hereinabove, the fine pores are restricted to a small average size and the presence of comparatively large fine pores is limited. Therefore, a powder having a very compact structure is provided. Even when such a thermal spray powder is used to form a thermal spray coating by a typical thermal spray method, practically all of the ceramic particles can be entirely melted. Further, even in the molten state, pores are unlikely to appear inside the molten particles or in the gaps therebetween, and the particles can be deposited in a monolayer compact state on a base material. As a result, it is possible to form a thermal spray coating of excellent erosion resistance which includes no through pores or in which through pores are unlikely to be formed even in long-term exposure to erosive plasma.

For example, JP-A No. 2006-225689 (FIG. 1) discloses a log differential pore volume distribution of the conventional melt sintered powder. In such conventional thermal spray material, the peak top of the main peak based on gaps between the particles is almost always observed at 10 μm or more. When the peak top of the second peak is at a fine pore size less than that of the peak top of the main peak, H2/H1 is almost always above 0.05.

Further, such a thermal spray powder can have a comparatively high fluidity because the ceramic particles can be in a smooth surface state. As a result, the powder can be easily supplied to a thermal spray apparatus and a high-quality homogeneous thermal spray coating can be formed. Furthermore, it is possible to form a thermal spray coating with excellent durability, such as erosion resistance, in which even when erosion is caused by erosive plasma, the resultant damage is restricted only to a very thin surface layer of the coating.

Ceramic materials with a melting point above 2000° C. are excluded from the scope of the present invention because even when the abovementioned condition relating to a pore size distribution is fulfilled, pores (and eventually through pores) are easily formed in the obtained thermal spray coating, and specific technical features disclosed herein are unlikely to be realized.

In a preferred mode of the thermal spray powder disclosed herein, the average particle size of the ceramic particles (including the secondary particles) is 1 µm or more and 20 µm or less. Since the thermal spray powder disclosed herein is compact, a thermal spray coating that has few pores and excellent erosion resistance can be formed in a comparatively broad particle size range such as indicated hereinabove.

In a preferred mode of the thermal spray powder disclosed herein, the ceramic material includes a halogen atom. With such a feature, the melting point of the ceramic material can be lowered. Further, when a thermal spray coating is formed using the thermal spray powder, the thermal spray powder is entirely melted, the presence of remaining unmelted particles can be suppressed more reliably, and through pores can be reduced.

In another aspect, the technique disclosed herein provides a thermal spray coating. The thermal spray coating is obtained by thermally spraying the thermal spray powder described hereinabove. As a result, a compact thermal spray coating that excels in durability and has good adhesion to a base material can be obtained.

The "ceramic material", as referred to in the present description, means a solid material constituted by an inorganic nonmetallic substance and is broadly inclusive of partially or entirely crystalline or amorphous materials.

BRIEF DESCRIPTION OF THE DRAWINGS

A single FIGURE illustrates the log differential pore volume distribution of thermal spray powders of various examples.

DESCRIPTION OF THE PREFERRED EMBODIMENTS

The thermal spray powder in accordance with the present invention will be described hereinbelow on the basis of the preferred embodiment with reference to the appended drawings. Matters which are necessary for implementing the present invention (for example, a method for thermally spraying the thermal spray powder) and which are not particularly referred to in the present specification can be understood as design matters for a person skilled in the art that are based on the related art in the pertinent field. The present invention can be implemented on the basis of the contents disclosed in the present specification and common technical knowledge in the pertinent field.

FIG. 1 shows a log differential pore volume distribution curve relating to: (a) a thermal spray powder according to an embodiment; (b) a thermal spray powder which is called a melt pulverized powder, and (c) a thermal spray powder which is called a granulated and sintered powder.

The thermal spray powder disclosed herein is used for forming a thermal spray coating by a thermal spraying method. The thermal spray powder includes ceramic particles constituted substantially of a ceramic material with a melting point of 2000° C. or less.

Further, the peak top of the main peak in the log differential pore volume distribution obtained by a mercury porosimetry is in a range of 10 µm or less. Further, where the second peak is present, when the peak top of the second peak is at a fine pore size less than that of the peak top of the main peak, the ratio (H2/H1) of a height H2 of the second peak to a height H1 of the main peak is 0.05 or less.

Although a ceramic material can be macroscopically compact, it essentially has a microscopically porous structure. It is also well known that the fine pore morphology derived from the porous structure affects physical properties of the material, such as a mechanical strength. In a thermal spray powder including ceramic particles, the fine pore morphology produces a significant effect on the melting state of the thermal spray particles when a thermal spray coating is formed by thermal spraying and on the pore morphology of the thermal spray coating formed by thermal spraying. Thus, the ceramic particles formed of a ceramic material are sprayed in a softened or molten state on the base material surface and rapidly solidified in a flattened state. The thermal spray coating is formed by successive stacking of such flat ceramic particles and formation of a stacked structure (lamellar structure).

In this case, where large fine pores (pores) are present in the unmelted portions of the flat ceramic particles, the lamellar structure can be distorted. As a result, bonding forces acting between the flat ceramic particles are weakened and through pores reaching from the surface of the thermal spray coating to the base material can be formed starting from the locations with a low bonding force. Since such through pores connect the surface of the base material with the external environment, they can induce erosion by the surrounding environment. Therefore, the absence of bubbles in the lamellar structure is important in terms of preventing the generation of through pores, and from this standpoint, the pore size distribution in the thermal spray powder and melting ability thereof during thermal spraying are very important indexes.

As mentioned hereinabove, in the thermal spray powder disclosed herein, the peak top of the main peak is specified to be within a range of 10 µm or less. It is also specified that when the peak top of the second peak is at a fine pore size less than that of the peak top of the main peak, the ratio (H2/H1) of the height H2 of the second peak to the height H1 of the main peak is 0.05 or less. Thus, it can be understood that in the thermal spray powder, the number of fine pores with a large fine pore size is small and the number of coarse peaks and valleys on the surface of individual particles of the thermal spray powder is also small. As a result of such a configuration, in the thermal spray powder, ceramic particles constituting the powder have few fine pores themselves and can be said to be compact. Therefore, such a thermal spray powder is preferred because the formation of pores is unlikely, for example, even under general thermal spraying conditions, and a compact thermal spray coating can be formed. Further, the configuration with only few coarse peaks and valleys on the surface of individual particles is preferred because flowability can be ensured when the thermal spray powder is to be supplied to a thermal spraying apparatus.

From the standpoint of obtaining a more compact thermal spray coating, the top (peak top) of the main peak is preferably within a range of 7 µm or less, more preferably 6 µm or less, and even more preferably 5 µm or less. It is particularly preferred that the top of the main peak be 4 µm or less, for example, 3 µm or less, or even 2 µm or less and 1 µm or less. The lower limit of the range including the top of the main peak is not particularly limited and can be, for example, 0.001 µm or more.

In the mercury porosimetry, a large surface tension of mercury is used and the pore distribution from a meso region to a macro region is determined from the relationship between the pressure applied to cause the penetration of mercury into the pores of the powder and the amount of the penetrated mercury. The measurements of the pore distribution based on the mercury porosimetry can be implemented, for example, on the basis of JIS R1655:2003 (Test Methods for Pore Size Distribution of Fine Ceramic Green Body by Mercury Porosimetry).

The log differential pore volume distribution in the present specification is also called a logarithmic differential pore size frequency distribution dV/d(log D) (here, D is the diameter of fine pores, and V is the volume of fine pores). This is a method for pore distribution representation which is generally used for representing the pore distribution in a comparatively broad pore size range.

The log differential pore volume distribution can be created from the relationship between the amount of penetrated mercury (that is, the pore volume) and the unit pore size change (can be also the unit pressure change) obtained by pore distribution measurements based on the mercury porosimetry. More specifically, as depicted in FIG. 1, this distribution can be created by dividing the differential pore volume (dV), which is the increment in the fine pore volume, by the differential value d(log D) of the logarithm of the pore size, and plotting the resultant value against the average pore size in each fine pore size region. In the present specification, the main peak, second peak, and tops and heights thereof are determined on the basis of the pore size distribution characteristic obtained by pore distribution measurements performed by the mercury porosimetry, for example, in a measurement range of 0.001 nm to 50 μm.

The main peak, as referred to in the present specification, means the peak with the largest height (frequency) (largest log differential pore volume) in the log differential pore volume distribution (curve). The second peak, as referred to herein, means the peak with the second largest height in the log differential pore volume distribution curve.

Generally, two types of fine pores are detected in the log differential pore volume distribution of thermal spray powders formed of ceramic materials, namely, (A) fine pores formed as gaps between the particles when the ceramic particles are aggregated, and (B) fine pores formed on the surface of ceramic particles on the basis of the porous structure of the ceramic. For example, where the particle size distribution of a thermal spray powder is not specifically adjusted, separate peaks are generally formed in the log differential pore volume distribution of such fine pores, as depicted by a curve in (c) in FIG. 1. Further, the fine pores formed on the surface of ceramic particles are smaller than the fine pores based on the gaps between the ceramic particles. When very fine ceramic particles are bonded (sintered) together to form ceramic particles (granules), as in the conventional so-called granulated and sintered powder, the fine pores formed in the gaps between the very fine ceramic particles are larger than the fine pores (A) formed in the gaps of the ceramic particles and, therefore, can be considered as fine pores (B) formed on the surface of the ceramic particles. The log differential pore volume distribution of the thermal spray powder disclosed herein may be a single-peak distribution in which the number of peaks based on such fine pores is one or a multipeak distribution in which the number of peaks is two or more.

The log differential pore volume distribution of the thermal spray powder disclosed herein is generally a single-peak distribution with one peak. Therefore, the single-peak distribution can be considered as the preferred distribution. In this case, since the peak based on the gaps between the ceramic particles (A) is reliably observed, it can be assumed that the peak based on the fine pores on the ceramic particle surface (B) is not observed or has been superimposed on the peak based on the gaps between the particles. In the latter case, the fine pores on the ceramic particle surface (B) can be ignored. Thus, since the log differential pore volume distribution features a single peak, it can be determined that a thermal spray has been formed in which the spread in the particle morphology or melting state among the individual particles during thermal spraying has been suppressed. Further, it can be said that the pores on the ceramic particle surface have a uniform size and no significant aggregation of the ceramic particles and formation of secondary particles have taken place.

It can be also said that the ceramic particles in such a thermal spray powder are configured of very compact particles having no fine pores (that is, peaks and valleys) on the surface. Further, since the top of the peak (main peak) in the single-peak distribution is within a range of the average fine pore size of 10 μm or less, it can be determined that the thermal spray powder is sufficiently compact. As a result, where a thermal spray coating is formed using the thermal spray powder, the pores derived from the gaps between the ceramic particles are unlikely to be formed in the coating and a more compact thermal spray coating can be formed.

Further, the log differential pore volume distribution of the thermal spray powder disclosed herein may also be a multipeak distribution including the second peak. The second peak is typically included when (A) the main peak is based on the gaps between the ceramic particles and (B) the second peak is based on the fine pores on the ceramic particle surface. In this case (that is, when the average fine pore size at the second peak is less than that at the main peak), the effect produced on the capability of the thermal spray powder to form a thermal spray coating needs to be taken into account. Thus, when the second peak is present and the top of the second peak is in a fine pore size region which is less than that of the top of the main peak, where the ratio (H2/H1) of the height H2 of the second peak to the height H1 of the main peak is 0.05 or less, the effect obtained can be substantially the same as that in the case of the single-peak distribution. In other words, where the fraction of the volume of the finer pores (fine pores on the particle surface) constituting the second peak is sufficiently small as compared the fraction of the volume of the coarser fine pores (gaps between the particles) constituting the main peak, a sufficiently compact thermal spray coating can be formed. The fractions of the pore volumes of those peaks can be estimated by the peak heights. It is preferred that the ratio (H2/H1) of the height H2 of the second peak to the height H1 of the main peak be 0.05 or less, more preferably 0.03 or less, and particularly preferably 0.01 or less.

A case can be also realized in which (A) the main peak is based on the gaps between the ceramic particles and the second peak appears in the region of pore sizes larger than that of the main peak.

For example, it can be also determined that the log differential pore volume distribution curve depicted in FIG. 1(a) is of a single-peak type. However, strict consideration indicates that the second peak can also be found in a region with a pore size of 20 μm or more which is still small. Such a peak is apparently attributable to large gaps between the particles which are caused by defective packing and could be formed because the measurement cell of the particle size distribution measuring device was not densely packed with the ceramic particles. For example, in FIG. 1(a), the height H2 of such a second peak is sufficiently small by comparison with the height H1 of the main peak. Such a second peak observed in a pore size region larger than that of the main peak suggests that the pore volume based on the fine pores with a larger pore size is sufficiently small. Therefore, it can be determined that the ability of such a thermal spray powder to form a thermal spray coating is unlikely to be particularly affected by the fine pores constituting the second peak.

Furthermore, from another viewpoint, the cumulative pore volume can be also considered as an index that can more directly represent the compactness of the thermal spray powder. The cumulative pore volume can be also called an integral fine pore volume and represents a sum total of the volumes of the fine pores (open pores) having a fine pore size in a predetermined range. For the thermal spray powder disclosed herein, it is preferred that the cumulative pore volume of the fine pores with a size (measured by the mercury porosimetry) of 1 μm or less be 0.01 cm$^3$/g or less. By controlling the cumulative pore volume of the fine pores with a size of 1 μm or less, it is generally possible to determine the volume of fine pores formed on the surface of the ceramic particles. When this value is 0.01 cm$^3$/g or less, it can be determined that the thermal spray powder is extremely compact. Thus, it can be assumed that where such a thermal spray powder is thermally sprayed and melted, a sufficiently compact thermally sprayed coating can be formed without the deposition on the base material in a state in which pores are included in the melted particles. The cumulative pore volume is more preferably 0.007 cm$^3$/g or less, even more preferably 0.005 cm$^3$/g or less. The lower limit value of the cumulative pore volume determined by the mercury porosimetry can be 0 cm$^3$/g.

In the field of the conventional thermal spray powders, the powders have been obtained by granulating finer melt pulverized particles into granules of a predetermined size and sintering, such powders being called "granulated and sintered powders", with the object of increasing fluidity. However, in the granulated and sintered powder, a large number of gaps are present between the individual fine ceramic particles constituting the granulated particles, and the top of the main peak in the log differential pore volume distribution can be present in a region above 10 μm. Furthermore, even when the top of the main peak is present in the range of 10 μm or less, a peak based on the fine pores formed in the gaps between the fine ceramic particles appears as the second peak and the ratio (H2/H1) of the height H2 of the second peak to a height H1 of the main peak is almost always larger than 0.05. Therefore, pores derived from the fine pores in the thermal spray powder can be formed in the thermal spray coatings obtained by thermally spraying such conventional thermal spray powders. Such pores are particularly visible in the portions of the thermal spray coatings where the thermal spray powder is unmelted. By contrast, with the thermal spray powder disclosed herein, the fine pores are controlled to a very small size range. The control also ensures a small fine pore volume. Therefore, the thermal spray powder substantially does not remain in an unmelted state. As a result, even though peaks and valleys are unavoidably formed in the thermal spray coating, the process of the peaks and valleys developing into through holes and adversely affecting the erosion resistance of the thermal spray coating is suppressed. Another advantage is that the powder with good fluidity can be provided and, therefore, a homogeneous thermal spray coating can be formed.

In the above-described thermal spray powder, the average particle size of the ceramic particles is preferably 1 μm or more and 20 μm or less. Where the average particle size exceeds 20 μm, the fraction of the ceramic particles in which the core portion is unmelted when the thermal spray powder is thermally sprayed increases and the probability of the unmelted particles remaining in the formed thermal spray coating increases. The presence of the unmelted ceramic particles in the lamellar structure observed in the thermal spray coating can decrease the bonding forces between the particles. This is also undesirable because the erosion caused by the surrounding environment can be initiated from the locations where the ceramic particles are weakly bonded. The average particle size of the ceramic particles can change according to a thermal spray apparatus used and may be, for example, 15 μm or less or 10 μm or less. A smaller average particle size is preferred because the obtained thermal spray coating becomes compact. Meanwhile a thermal spray powder in which the particles are too small is undesirable because the powder can be easily overheated and overmelted (entirely liquefied) in the thermal spray process and cracks can be appear inside the thermal spray coating or on the surface thereof, nodules (surface protrusions) can be induced, the material composition can be changed, and local defects can be induced. From this standpoint, the average particle size of the ceramic particles is preferably, for example, 3 μm or more, more preferably 5 μm or more.

A typical thermal spray powder, for example, with an average particle size of about 15 μm or less, is undesirable because the particles scattered in the thermal spray process make no contribution to the formation of the thermal spray coating. By contrast, since the thermal spray powder disclosed herein is provided as a compact powder with a high specific gravity, it is not particularly required to be prepared as a slurry, and a thermal spray coating can be advantageously formed by thermal spraying by the usual method.

Further, in the present specification, the average particle size of the ceramic particles means a particle size at integral 50% (50% volume-average particle size; $D_{50}$) in the particle size distribution measured with the particle size distribution measuring device based on the laser scattering and diffraction method.

The composition of the ceramic material constituting the above-described thermal spray powder is not particularly limited, provided that the melting point is 2000° C. or less. For example, crystalline inorganic materials which are nonmetal materials can be broadly included. More specifically, for example, oxide ceramics formed of metal oxides, nitride ceramics formed of metal nitrides, carbide ceramics formed of metal carbides, and also ceramic metal materials formed of metal borides, halides (fluorides, oxyfluorides, chlorides, etc.), hydroxides, carbonates, and phosphates can be considered.

Examples of metal elements constituting the ceramic include one, or two or more selected from semimetal elements such as B, Si, Ge, Sb, and Bi, typical elements such as Mg, Ca, Sr, Ba, Zn, Al, Ga, In, Sn, and Pb, transition metal elements such as Sc, Y, Ti, Zr, Hf, V, Nb, Ta, Cr, Mo, W, Mn, Fe, Co, Ni, Cu, Ag, and Au, and lanthanoid elements such as La, Ce, Pr, Nd, Sm, Er, and Lu. The preferred among them are one, or two or more selected from Mg, Y, Ti, Zr, Cr, Mn, Fe, Zn, Al, and Er.

With the ceramic material with a melting point of 2000° C. or less, where the raw material is heated according to the usual method to obtain a thermal spray powder of an adequate form, the raw material is unavoidably oxidized. For this reason, it has been difficult to obtain a compact thermal spray powder such as described hereinabove, or a thermal spray powder of the target composition. However, with the thermal spray powder disclosed herein, the research of a variety of techniques for heating raw materials has demonstrated that a dense thermal spray powder such as described hereinabove can be obtained even with a ceramic material with a melting point of 2000° C. or less. From this standpoint, it is preferred that the thermal spray material disclosed herein be configured of a material with a lower melting point, such as 1800° C. or less, even more preferably 1700° C. or less. The lower limit of the melting point is not particularly limited, and for example a ceramic material with a melting point of 400° C. or more (for example, 500° C. or more) may be used.

The preferred examples of the ceramic materials with a melting point of 2000° C. or less include metal oxides represented by silica (1726° C.), titania (1870° C.), and manganese oxide (1650° C.), complex oxides represented by mullite (1850° C.) and cordierite (1450° C.), halides represented by yttrium fluoride (1660° C.), oxyhalides represented by yttrium oxyfluoride (about 1600° C.) and yttrium oxychlorofluoride (about 1600° C.), and ceramic materials including other halogen elements. The temperature indicated after the ceramic material hereinabove represents the melting point which is generally known for the respective ceramic material and does not indicate the accurate melting point of the material.

The application of the thermal spray powder in accordance with the present invention with respect to ceramic materials including halides, oxyhalides, and other halogen elements, which are particularly easily oxidized, is preferred because remarkable utility thereof can be demonstrated. A thermal spray powder of a composition including a halogen element and a rare earth elements is particularly preferred because a thermal spray coating with excellent resistance to erosion induced by halide plasma, such as fluorine plasma and chlorine plasma (resistance to plasma-induced erosion), can be obtained. While not necessarily limiting, examples of such ceramic materials include rare earth element halides represented by the general formula $RX_3$ and rare earth element oxyhalides represented by the general formula $RO_{1-n}X_{1+2n}$ or $(RO)_n{}^{n+}X$. In the general formulas, R is at least one rare earth element, X is at least one halogen element, and n is an integer of 0 or more. The preferred examples of the rare earth element R include Y, La, Ce, Pr, Nd, Sm, Eu, Gd, Tb, Dy, Ho, Er, Tm, Yb, and Lu which can be used individually or in combinations of two or more thereof. The preferred examples of the halogen element X include F, Cl, Br, and I which can be used individually or in combinations of two or more thereof. More specific examples are presented below.

Halides such as $YF_3$, $YCl_3$, $YBr_3$, $LaF_3$, $LaCl_3$, and $LaBr_3$.

Oxyhalides such as YOF, $Y_5O_4F_7$, $Y_6O_5F_8$, $Y_7O_6F_9$, $Y_{17}O_{14}F_{23}$, YOCl, YOBr, YOFCl, YOBrCl, LaOF, PrOF, NdOF, SmOF, and GdOF.

In the ceramic materials presented by way of example hereinabove, some or all of the constituent elements may be replaced by other elements. Further, in the ceramic materials presented hereinabove, the two or more elements may constitute a composite (inclusive of a solid solution). For example, ROX—$RX_3$ composite particles may be used in which the aforementioned ROX and $RX_3$ are combined.

A variety of other elements may be added, for example, with the object of obtaining the desired properties, to the abovementioned ceramic material. Further, the ceramic material of any one type may individually constitute the ceramic particles, or the ceramic particles of two or more types may be mixed, or ceramic particles may be constituted by forming a composite of the ceramic materials of two or more types. For example, when the ceramic materials of two or more types are included in the ceramic particles, some or all of those ceramic materials may form a composite.

As long as the thermal spray powder in accordance with the present invention includes a ceramic material with a melting point of 2000° C. or less, other materials with a melting point of 2000° C. or less may be combined therewith. Various resin materials such as thermoplastic resins and thermosetting resins, and various metal materials can be considered as such other materials. The combinations of the ceramic materials and other materials are not particularly limited and a variety of configurations may be used. The preferred specific examples include: (a) a mixed powder in which particles formed of the ceramic material are mixed with particles formed of other materials, and (b) a composite powder (can be in the form of a laminated material or coated material) in which the other material is provided on at least part of the surface of the particles formed of the ceramic material. Typical examples of such combinations include cermets in which a ceramic material is integrated with a metal material.

The thermoplastic resins are inclusive, without any particular limitation, of a variety of synthetic resins demonstrating thermal plasticity which enables molding under heating. The term "thermoplastic", as used in the present specification, stands for ability to soften and plastically deform reversibly under heating and cure reversibly under cooling. Generally, resins having a chemical structure formed of linear or branched polymers can be considered as the thermoplastic resins. Specific examples of such resins include general-purpose resins such as polyvinyl chloride (PVC), polyethylene (PE), polypropylene (PP), polystyrene (PS), thermoplastic polyesters, acrylonitrile-butadiene-styrene (ABS), acrylonitrile-styrene (AS), polymethyl methacrylate (PMMA), polyvinyl alcohol (PVA), polyvinylidene chloride (PVDC), and polyethylene terephthalate (PET); engineering plastics such as polyamides (PA), polyacetals (POM), polycarbonates (PC), polyphenylene ethers (PPE), modified polyphenylene ethers (m-PPE; also referred to as m-PPO), polybutylene terephthalate (PBT), ultra-high molecular weight polyethylene (UHPE), and polyvinylidene fluoride (PVdF); and super-engineering plastics such as polysulfones (PSF), polyether sulfones (PES), polyphenylene sulfides (PPS), polyarylates (PAR), polyamideimides (PAI), polyether imides (PEI), polyether ether ketone (PEEK), polyimides (PI), liquid crystalline polymers (LCP), and polytetrafluoroethylene (PTFE). Among them, resins such as polyvinyl chloride, polycarbonates, polyalkylene terephthalates such as PET and PBT, and polymethyl methacrylate are preferred. Those resins may be used individually or in combinations of two or more thereof.

The thermosetting resins are inclusive, without any particular limitation, of a variety of synthetic resins in which polymerization is initiated by heating, a network polymer structure is formed, and the resin is irreversibly cured. The term "thermosetting", as used in the present specification, stands for a property such that a reaction advances in the polymer under heating, bridging is initiated, a network structure is formed, and curing proceeds. Specific examples of such resins include phenolic resins (PF), epoxy resins (EP), melamine resins (MF), urea resins (UF), unsaturated polyester resins (UP), alkyd resins, polyurethanes (PUR), and thermosetting polyimides (PI). Among them, phenolic resins, epoxy resins, and polyurethanes are preferred. The thermosetting resin may be, for example, in a state of a mixture of low-molecular monomers, or a polymer in which polymerization has advanced to a certain degree. The thermosetting resins may be used individually or in combinations of two or more thereof (including blending).

The metal material may be formed of a variety of individual metal elements or alloys thereof. The alloy, as referred to herein, includes one metal element and one or more other elements and is inclusive of substances demonstrating metallic properties. The elements may be combined in the form of a solid solution, an intermetallic compound, or a mixture. When the metal material is an alloy, the number of the constituent elements is not particularly limited. For example, there may be two elements (binary alloy), three elements (ternary alloy), or more elements. Specific examples of the metal elements constituting the metal material include semimetals such as B, Si, Ge, Sb, and Bi, typical elements such as Mg, Ca, Sr, Ba, Zn, Al, Ga, In, Sn, and Pb, transition metal elements such as Sc, Y, Ti, Zr, Hf, V, Nb, Ta, Cr, Mo, W, Mn, Fe, Co, Ni, Cu, Ag, and Au, and lanthanoid elements such as La, Ce, Pr, Nd, Er, and Lu.

The content ratio of the ceramic material in the thermal spray powder is not particularly limited. For example, the ceramic material can be compounded at any ratio, provided that the effect thereof is demonstrated. From the standpoint of forming a thermal spray coating with better erosion resistance, it is preferred that the content ratio of the ceramic material be large. The content ratio of the ceramic material in the thermal spray powder is preferably 95 mass % or more, more preferably 99 mass % or more, even more preferably 99.9 mass % or more, and can be, for example, 99.99 mass % or more (100 mass %, except for unavoidable impurities).

Further, the purity of those ceramic materials is also not particularly limited. However, for example, in applications in which a thermal spray coating with higher functionality is to be formed, it is preferred that the admixture of unintended substances (elements) be avoided and a higher purity of the ceramic material is preferred. From this standpoint, it is preferred that the purity of the ceramic material be 95 mass % or higher, more preferably 99 mass % or higher, still more preferably 99.9 mass % or higher, and can be, for example, 99.99 mass % or higher (100 mass %, except for unavoidable impurities).

A method for manufacturing the thermal spray powder disclosed herein is not particularly limited, and for example the following method can be used. Thus, fine ceramic particles with a comparatively small particle size (for example, an average particle size of 0.01 μm to 10 μm) are compacted through a molten state and pulverized and sized (classified, screened), as necessary, to form compact ceramic particles disclosed herein. The abovementioned melting may be implemented in an oxygen-containing atmosphere (typically, in the air), or in an oxygen-free atmosphere (typically an inactive gas atmosphere such as nitrogen or rare gases, or vacuum atmosphere). For example, when the ceramic material is a non-oxide ceramic material, in particular, a ceramic material including a halide, an oxyhalide, or other halogen elements which are easily oxidizable, it is preferred that heating be performed in an inactive atmosphere (for example, in a vacuum calcining furnace), or at a comparatively low temperature which is equal to or higher than the melting point and equal to or lower than 2000° C. In the thermal spray powder formed in this manner, since a plurality of fine ceramic particles have been compacted through the molten state, the development of crystallites of oxides constituting the ceramic does not proceed and relatively rounded particles having no corners can be obtained.

The thermal spray powder disclosed herein can be used to form a thermal spray coating on a variety of base materials by performing thermal spraying by any of a plurality of thermal spray methods. The thermal spray method is not particularly limited, and a plasma spray method such as atmospheric plasma spraying (APS), low pressure plasma spraying (LPS), and high pressure plasma spraying, and high velocity flame spraying such as high velocity oxygen flame (HVOF) spraying, warm spraying, and High Velocity Air flame (HVAF) spraying can be advantageously used. The thermal spray powder can be supplied to a thermal spray apparatus in the form of a powder or slurry obtained by dispersing in a suitable dispersion medium.

The type of the base material for forming the thermal spray coating is not particularly limited. Suitable examples of the base material include aluminum, aluminum alloys, iron, steel, copper, copper alloys, nickel, nickel alloys, gold, silver, bismuth, manganese, zinc, and zinc alloy. From the standpoint of further increasing the erosion resistance as a result of forming a thermal spray coating with the thermal spray powder disclosed herein and clarifying the merits of the present invention, the following base materials selected from the generally used metal material are preferred: steels such as various SUS materials (can be the so-called stainless steel) which are used for corrosion-resistant structures, aluminum alloys such as aluminum alloys of 1000 series to 7000 series which are suitable as lightweight structural materials, and corrosion-resistant alloys based on Ni, Co, and Fe, such as Hastelloy, Inconel, Stellite, and Invar.

Further, since high fluidity of the thermal spray material disclosed herein can be maintained regardless of the average particle size thereof, the thermal spray material can be smoothly and efficiently supplied to the thermal spray apparatus and a high-quality thermal spray coating can be formed with good productivity. Therefore, a method for supplying the thermal spray material to the thermal spray apparatus is not particularly limited. It is preferred that the thermal spray material be supplied by an axial feed method, that is, in the same direction as the axis of the jet flow generated in the thermal spray apparatus. Form the standpoint of preventing the adhesion of the thermal spray material to the thermal spray apparatus, it is preferred that the thermal spray material be supplied to the thermal spray apparatus by the axial feed method which enables better fluidity of the thermal spray material and makes it possible to form efficiently a homogeneous coating.

Although the thermal spray material disclosed herein is constituted by a ceramic material, it can be entirely melted during thermal spraying. Further, since the thermal spray material is compact by itself, the obtained thermal spray coating can be a pore-free dense ceramic coating. Therefore, the thermal spray coating can have functions close to those of a bulk ceramic material and excellent erosion resistance. Such a thermal spray coating can be realized, for example, with a porosity of 5% or less (preferably 3% or less, particularly preferably 1% or less, for example, 0.5% or less), although such values are not limiting.

In addition to compactness, such a thermal spray coating can excel, for example, in electric properties such as insulation property, wear resistance, and erosion resistance (environment blocking property) correspondingly to the physical properties of the ceramic material constituting the thermal spray powder. Therefore, the coated products provided with such a thermal spray coating can be advantageously used for a variety of applications. Examples of such advantageous application of such a thermal spray coating include protective coatings on various parts requiring wear resistance and erosion resistance. More specifically, the thermal spray coating can be particularly advantageously used as a protective coating for semiconductor fabrication devices. Likewise, the thermal spray coating can be particularly advantageously used as a protective coating for plant equipment exposed to corrosive environment created by corrosive ions or corrosive gases in gas (natural gas, biogas, etc.), powder, petroleum, and chemical plants. The protective coating may be provided on new parts and also with the object of repairing the parts which have already been subjected to erosion.

The examples of the present invention are explained hereinbelow, but the present invention is not intended to be limited to the below-described examples.

Thermal spray powders of 17 types having the compositions and physical properties presented in Table 1 below were prepared. The environment blocking ability of the thermal spray coatings obtained by thermally spraying those thermal spray powders was estimated by measuring the porosity as described hereinbelow. The resistance to erosion induced by chlorine and fluorine was estimated by measuring the degree of erosion observed in the obtained thermal spray coatings in a salt water spray test and an aqueous solution of hydrofluoric acid. The results are presented in Table 1.

The thermal spray powders No. 1 to 8 were fabricated by using fine ceramic particles (average particle size 0.01 μm to 10 μm) formed of ceramic materials with compositions presented in the "Material composition" column in Table 1, melting the particles by heating at a temperature equal to or higher than the melting point, and pulverizing and sizing as appropriate. As indicated by the average particle size of the obtained thermal spray powders, those thermal spray powders have been formed by integrating a plurality of fine particles used as a starting material by melting.

The thermal spray powders No. 9 to 12 were prepared by the following method. Thus, initially, starting material powders were compounded such as to obtain the ceramic materials of the compositions presented in the "Material composition" column in Table 1. Then, the starting material powders were heated and melted, and then cooled to prepare a solid body (ingot). The solid body was pulverized by a mechanical means.

The thermal spray powders No. 13 to 17 were prepared by the well-known granulation-sintering method. Thus, initially, fine ceramic particles (average particle size 0.01 μm to 5 μm) formed of the ceramic material of the composition presented in the "Material composition" column in Table 1 was dispersed in a 3.6% aqueous solution of polyvinyl alcohol (PVA) to prepare a slurry. The slurry was atomized in a gas flow by using an atomizing granulator and dried to prepare granulated particles with a size of about 1 μm to 45 μm. A granulated and sintered powder was then obtained by subjecting the granulated particles to sintering by holding at a temperature below the melting point of the ceramic material. The granulated and sintered powder thus obtained was pulverized, as necessary, by using a ball mill.

The physical properties of the thermal spray powders No. 1 to 17 are presented in Table 1. Methods for measuring the physical properties presented in Table 1 are explained below.

[Average Particle Size $D_{50}$]

The average particle size of each thermal spray powder was measured using a laser diffraction/scattering particle size meter (LA-300, manufactured by Horiba Seisakusho KK). The average particle size is a $D_{50}$ particle size based on a volume-standard particle size distribution. The measurement results relating to the average particle size of the spray powders are presented in the "$D_{50}$" column of Table 1.

[Pore Size Distribution]

The fine pore volume characteristic of each thermal spray powder was measured according to JIS R1655:2003 by using an automatic porosimeter (pore distribution measuring device Autopore IV 9520 type, manufactured by Micromeritics Co.) based on the mercury porosimetry. More specifically, 0.5 g measurement samples were used and the penetration of mercury was induced under an initial pressure of 11 kPa. The contact angle of mercury with the measurement samples was set to 130 degrees and the mercury surface tension was set to 485 dynes/cm. The log differential pore volume distribution curve was plotted by using the available analytical software from the relationship between the pressure and the amount of penetrated mercury which was obtained under the abovementioned conditions. The fine pore size at the top of the main peak, the height ratio (H2/H1) of the second peak and main peak, and the cumulative pore volume of pores with a pore size of 1 μm or less were calculated on the basis of the measurement results. The calculation results are presented in the "Main peak top", "H2/H1", and "Cumulative pore volume" columns in Table 1. For the thermal spray powders represented by "−" in the "H2/H1" column, the log differential pore volume distribution curve was generally a single-peak curve and the second peak was not observed in the region of fine pore sizes less than those of the main peak. The log differential pore volume distribution curves plotted for (a) No. 1, (b) No. 11, and (c) No. 17 are presented in FIG. 1.

[Material Melting Point]

The melting point of each thermal spray powder was determined on the basis of the temperature variation characteristic obtained when the thermal spray powder was heated according to a predetermined temperature program by using a differential thermal analyzer (Thermo plus Evo, manufactured by Rigaku KK). The measurement results relating to the melting points of the thermal spray powders are presented in the "Melting point column" in Table 1. The melting point was represented by "≤1500", "≤1700", and ">2000" when the melting point was 1500° C. or less, more than 1500° C. and equal to or less than 1700° C., and more than 2000° C., respectively. In the examples of the present embodiment, the melting point was more than 1700° C. and equal to or less than 2000° C. for none of the thermal spray powders.

[Thermal Spray Method]

The thermal spray coatings were formed by thermally spraying the thermal spray powders No. 1 to 17, which were prepared in the above-described manner, by atmospheric plasma spraying (APS) which is a low-temperature process.

Thermal spraying conditions in APS are described below. Thus, initially an SS400 steel plate (70 mm×50 mm×2.3 mm) was prepared as a base material and subjected to surface roughening by blasting with a #40 alumina grid. A commercial thermal spray apparatus (SG-100, manufactured by Praxair Co.) was used for the APS. A 0.34 MPa argon gas as a plasma working gas and 0.34 MPa helium gas as a secondary gas were supplied under atmospheric pressure to the thermal spraying device, and plasma was generated by applying a voltage between an anode and a cathode. The generation of plasma during thermal spraying was conducted under a plasma generation voltage of 35.6 V and a current of 900 A. The thermal spray powder of each example was supplied at a rate of about 15 g/min into the plasma by using a powder feeder (Model 1264, manufactured by Praxair Co.), and thermal spray coatings No. 1 to 17 (parts with thermal spray coatings) were formed at a thermal spray distance of 150 mm and a plasma irradiation angle of the base material of 60°, while moving a thermal spray gun at a speed of 800 mm/sec.

[Estimation by Porosity]

The compactness of the thermal spray coatings No. 1 to 17 formed in the abovementioned-manner was estimated by measuring the porosity. The porosity was determined by image analysis of the observation image of the cross-sectional structure substantially perpendicular to the base material. More specifically, the thermal spray coating was cut perpendicularly to the base material surface for each base material and a random cross section in the thickness direction was cut out. The observation image obtained by observing the structure of the thermal spray coating in the cross section under a microscope with an adequate magnification ratio was analyzed using image analysis software. As a result, the binarization separating a porous portion and a solid phase portion was performed and the porosity (%) specified as a ratio of the surface area of the porous portion in the entire cross section area was calculated. In porosity measurements in the present specification, the image analysis was performed using the image analysis software (Image-Pro Plus, produced by Nippon Roper Co.) on the basis of the observation image (preferably either one of the secondary electron image, structural image, and X-ray image) obtained with a scanning electron microscope (SEM; S-3000N, manufactured by Hitachi High-Technologies Co.). The results of the analysis are presented in the "Porosity" column in Table 1.

[Estimation of Erosion Resistance by Salt Water Spraying Test]

Resistance of the thermal spray coatings No. 1 to 17 formed in the above-described manner to chlorine-induced erosion was estimated by a salt water spraying test. The salt water spraying test was conducted according to JIS Z2371: 2000 (Salt Water Spraying Test Methods) under the following conditions: temperature of a salt solution storage tank for testing: 35±1° C., temperature of an air saturation container: 47±1° C.° C., sprayed amount: 1 mL/hr to 2 mL/hr, supplied air pressure: 0.098±0.002 MPa, and test time: 12 hr at maximum. The estimation of erosion resistance by salt water spraying was performed by observing the coating surface on the parts with the thermal spray coating 2 hr, 6 hr, and 12 hr after the test was started and confirming the presence/absence of erosion products from the SS 400 steel plate serving as a base material. In the results, the symbol "x" representing "poor" relates to a coating film in which the erosion products were formed within 2 hr after the test was started, the symbol "Δ" representing "intermediate" relates to a coating film in which the erosion products were formed within 2-6 hr after the test was started, the symbol "○" representing "good" relates to a coating film in which the erosion products were formed within 6-12 hr after the test was started, and the symbol "⊗" representing "excellent" relates to a coating film in which the erosion products were not confirmed after 12 h. The results are presented in the "Salt water spraying test" column in Table 1.

[Estimation of Erosion Resistance by HF Erosion Test]

Erosion resistance of the thermal spray coatings No. 1 to 17 formed in the above-described manner was estimated by a test for erosion induced by an aqueous solution of hydrofluoric acid. A three-electrode electrochemical cell was used for the erosion test. Thus, initially, a working electrode was prepared by masking the surface of the thermal spray coatings No. 1 to 17 as test samples such that only the test surface of 10 mm×10 mm was exposed and connecting the base material to a metal wiring. The weight of each thermal spray coating was measured in advance for each base material and the weight of the thermal spray coating was obtained by subtracting the weight of the base material. The three-electrode cell was constructed by using a silver-silver chloride electrode (Ag/AgCl) as a reference electrode, a platinum (Pt) electrode as a counter electrode, and a 1 M aqueous solution of hydrofluoric acid (HF aq.) heated to 40° C. as an electrolytic solution.

A reaction between the electrolytic solution and the test surface of the working electrode was induced by applying a voltage of 1 V with a potentiostat between the reference electrode and working electrode of the cell for 200 sec, and the test surface was eroded. The weight reduction amount of the test surface of the thermal spray coating caused by erosion was calculated by measuring the weight of the thermal spray coating after the erosion. The weight reduction amount normalized by the pre-erosion weight of the thermal spray coating constituting the test surface was determined from the calculated amount. In the results, the symbol "⊗" representing "excellent" relates to the case in which the weight reduction amount was 0.1% or less, the symbol "○" representing "good" relates to the case in which the weight reduction amount was more than 0.1% and less than 0.5%, the symbol "Δ" representing "intermediate" relates to the case in which the weight reduction amount was 0.5% or more and less than 1%, and the symbol "x" representing "poor" relates to the case in which the weight reduction amount was 1% or more. The results are presented in the "HF erosion test" column in Table 1.

TABLE 1

| No. | Material composition | Main peak top (μm) | H2/H1 | Cumulative pore volume (cm$^3$/g) | $D_{50}$ (μm) | Material melting point (° C.) | Porosity (%) | Erosion resistance (salt water spraying test) | Erosion resistance (HF erosion test) |
|---|---|---|---|---|---|---|---|---|---|
| 1 | YF$_3$ | 1.4 | — | 0.001 | 19.3 | ≤1500 | 4.8 | ○ | ○ |
| 2 | Y$_5$O$_4$F$_7$ | 1.1 | 0.03 | 0.001 | 9.4 | ≤1700 | 2.2 | ⊗ | ○ |
| 3 | YOF | 1 | 0.01 | 0.006 | 12.6 | ≤1700 | 3.7 | ⊗ | ○ |
| 4 | YOFCl | 2.6 | — | 0.003 | 13.9 | ≤1500 | 4.1 | ⊗ | ○ |
| 5 | YOF | 4.3 | — | 0.002 | 15.6 | ≤1700 | 4.5 | ⊗ | ○ |
| 6 | YF$_3$ | 1.8 | — | 0.001 | 5.1 | ≤1500 | 0.8 | ⊗ | ⊗ |
| 7 | YOF | 2.3 | 0.01 | 0.007 | 1.3 | ≤1700 | 0.1 | ⊗ | ⊗ |
| 8 | YOFCl | 0.7 | 0.03 | 0.001 | 2.7 | ≤1500 | 0.2 | ⊗ | ⊗ |
| 9 | Y$_2$O$_3$ | 4.1 | — | 0.001 | 3.2 | >2000 | 0.3 | Δ | X |
| 10 | Al$_2$O$_3$ | 9.3 | — | 0.001 | 6.9 | >2000 | 0.9 | Δ | X |
| 11 | Al$_2$O$_3$ | 8 | — | 0.002 | 25 | >2000 | 8.7 | X | X |

TABLE 1-continued

| No. | Material composition | Main peak top (μm) | H2/H1 | Cumulative pore volume (cm³/g) | $D_{50}$ (μm) | Material melting point (° C.) | Porosity (%) | Erosion resistance (salt water spraying test) | Erosion resistance (HF erosion test) |
|---|---|---|---|---|---|---|---|---|---|
| 12 | $Y_2O_3$ | 7.6 | — | 0.001 | 31 | >2000 | 18.4 | X | X |
| 13 | $YF_3$ | 11.4 | 0.31 | 0.076 | 29 | ≤1500 | 14.6 | X | Δ |
| 14 | $Y_5O_4F_7$ | 9.7 | 0.11 | 0.054 | 30 | ≤1700 | 12.6 | X | Δ |
| 15 | YOFCl | 10.8 | 0.2 | 0.103 | 33 | ≤1500 | 15.6 | X | Δ |
| 16 | YOF | 10.3 | 0.25 | 0.049 | 27 | ≤1700 | 12.2 | X | Δ |
| 17 | $Y_2O_3$ | 8.4 | 0.07 | 0.026 | 34 | >2000 | 17.6 | X | X |

As indicated in Table 1, the thermal spray powders No. 1 to 8 were materials with a melting point of 2000° C. or less, the position of the main peak in the log differential pore volume distribution was at 10 μm or less, and (H2/H1) was 0.05 or less. A small cumulative pore volume of 0.01 cm³/g or less and compactness of the thermal spray powders themselves were confirmed for those thermal spray powders. It was also confirmed that by using such thermal spray powders, it was possible to obtain a compact thermal spray coatings with a porosity of 5% or less with the general-purpose APS device.

Since those thermal spray coatings were compact, excellent erosion resistance thereof in the salt water spraying test was confirmed. For example, it was determined that practically no through holes, such that salt water (chloride ions) could permeate therethrough, were formed in the thermal spray coatings formed from the thermal spray powders No. 2 to 8. Further, it was confirmed that since those thermal spray coatings could be formed without distorting the composition of the thermal spray powders by the AP thermal spraying at a comparatively low temperature, excellent erosion resistance could be demonstrated even in the erosion test conducted with a strong acid containing a halogen (for example, fluorine), such as hydrofluoric acid. This result also suggests high resistance to plasma-induced erosion with respect to halogen plasma. In particular, as indicated in No. 6 to 8, it was confirmed that for fine thermal spray powders with an average particle size of 10 μm or less, in particular, 3 μm or less, an extremely compact thermal spray coating with a porosity of 1% or less, in particular 0.3% or less, was obtained, thereby making it possible to obtain a thermal spray coating with higher resistance to erosion (environment blocking ability) caused by halogen substances such as chlorine and fluorine.

For example, it is clear that in the pore size distribution of the thermal spray powder No. 1 in FIG. 1(a), the main peak appears close to 1.4 μm and fine pores derived from gaps between the particles are formed with an average fine pore size of 1.4 μm as a peak. Further, it can be found that no clear peaks are observed in a region with a fine pore size less than that of the peak derived from the gaps between the particles, and no fine pores are formed on the surface of individual particles constituting the thermal spray powder. The pore distribution in the thermal spray powder No. 1 can be generally considered to be a single-peak distribution, but several fine peaks can be found in a region with a fine pore size larger than that of the main peak. Those peaks are apparently derived from large gaps between the particles which occur because the thermal spray powder No. 1 includes somewhat distorted particles due to the intimate bonding of several ceramic particles, and the measurement cell is not densely packed. However, the H2/H1 ratio determined by taking the peak observed in such a region with a large fine pore size as a second peak is sufficiently small, and a compact thermal spray coating can be formed using such a thermal spray powder. Therefore, it can be determined that the effect produced by the fine pores derived from such large gaps between the particles on the compactness of the thermal spray coating is small.

The thermal spray powders No. 9 to 12 were all prepared by entirely melting the starting material powders by the conventional so-called melting method, all of the powders had a small cumulative pore volume of 0.01 cm³/g or less, and the prepared thermal spray powders were themselves comparatively compact. More specifically, for example, the pore distribution of the thermal spray powder No. 11 depicted in FIG. 1(b) is a single-peak distribution with the main peak observed at 8 μm. In the pore distribution of such a thermal spray powder, the second peak is not observed. Therefore, such a thermal spray powder is apparently a sufficiently compact powder with the position of the main peak in the log differential pore volume distribution at 10 μm or less and (H2/H1) of 0.05 or less. This is an advantage obtained as a result of completely melting the starting material powder, and such a thermal spray powder is achieved because of using a material with a melting point higher than 2000° C.

However, the melt obtained by such complete melting is difficult to solidify directly into fine particles, and where mechanical pulverization is used therefor, a thermal spray powder can be obtained which has a comparatively large average particle size and degraded fluidity. For this reason, in the thermal spray coating obtained by thermally spraying such a comparatively coarse thermal spray powder having a high melting point by the APS method, unmelted portions unavoidably remain during thermal spraying, and the coating has a porosity of 8.7%, that is, lacks compactness. Meanwhile, when a thermal spray powder with a small average particle size was used, as in the case of powders No. 9 and 10, comparatively compact coatings could be formed. However, it was confirmed that even when comparatively dense coatings were formed, erosion occurred in both coatings in the salt water spraying test and through pores could be easily formed in such thermal spray coatings. Furthermore, it was confirmed that such coatings had a low resistance to erosion induced by strong acids including a halogen, such as hydrofluoric acid. Further, it was confirmed that where an attempt was made to produce a thermal spray powder with such a pore distribution by using a material with a melting point of 2000° C. or less and the conventional melting method, the material was modified (no specific data are presented herein).

The thermal spray powders No. 13 to 17 were comparatively porous powders obtained by granulating the raw material powders and then sintering. Further, for example, as demonstrated by the pore distribution of the thermal spray powder (c) No. 17 in FIG. 1, the main peak was observed at substantially the same position (close to 10 μm) as in (b) No. 11, and the second peak was clearly observed at a position with a smaller fine pore size than that of the main peak. Since the thermal spray powder No. 17 was fabricated by the conventional granulation-sintering method, the second peak apparently indicates the fine pores derived from the porous structure of the ceramic particles, and the main peak apparently indicates the fine pores derived from the gaps between the primary particles constituted the granulated particles.

Since the ratio (H2/H1) of the height H2 of the second peak to the height H1 of the main peak in the pore distribution is larger than 0.05, it can be determined that the thermal spray powders No. 13 to 17 are porous (a large volume of fine pores). Since among the powders No. 13 to 17, the thermal spray powders No. 14 and 17 used finer ceramic microparticles as the starting material powders, the main peaks were observed at 9.7 μm and 8.4 μm, respectively, that is, in a region less than 10 μm. However, because coarser ceramic microparticles were used for other thermal spray powders No. 13, 15, and 16, it was confirmed that the fine pores based on the gaps between the particles increased in size and the main peak appeared in a region with a larger fine pore size. The porosity of the thermal spray coatings formed using such thermal spray powders was, for example, 17.6% in the thermal spray powder No. 17, and the coating lacked compactness. Furthermore, several unmelted particles accompanied by bubbles were observed in the structure of the thermal spray coating when the porosity was measured. It can be said that when such comparatively porous thermal spray powders are used, a compact thermal spray coating is difficult to obtain. For this season, erosion was confirmed within 2 hr and through pores were formed in the thermal spray coatings in the salt water spraying test of each powder.

The thermal spray powders No. 13 to 16 have a composition including a halogen. For this reason, the thermal spray coatings No. 13 to 16 obtained from those thermal spray powders demonstrated only a slightly degraded erosion resistance in the HF erosion test even when the porosity exceeded 10%. This result indicates the erosion resistance superior to that, for example, of the compact thermal spray coatings No. 9 to 12 and 17.

From this perspective, it can be confirmed that the thermal spray powders No. 1 to 8 which make it possible to form extremely compact thermal spray coatings without deviations in composition by using materials of low-melting compositions in which deviations of compositions easily occur are particularly excellent as materials for forming thermal spray coatings requiring erosion resistance.

[Estimation of Erosion Resistance by HCl Erosion Test]

Erosion resistance was also estimated by an erosion test using hydrochloric acid (HCl) with respect to the thermal spray coating obtained from the thermal spray powder No. 8 which demonstrated good results in both the salt water spraying test and the HF erosion test. More specifically, the HCl erosion test was conducted using a 1M aqueous solution of hydrochloric acid (HCl) instead of the 1M aqueous solution of HF in the abovementioned-described HF erosion test, other conditions being the same. The results demonstrated that the weight reduction ratio of the thermal spray coating was 0.1% or less and confirmed that the thermal spray coating had a high erosion resistance with respect to a chlorine-containing strong acid such as hydrochloric acid. Those results indicate that the thermal spray coating excelled in resistance to plasma-induced erosion with respect to halogen plasmas including chlorine.

The present invention is described hereinabove on the basis of the preferred embodiments thereof, but this description is not limiting, and it goes without saying that various modifications can be made.

What is claimed is:

1. A thermal spray powder comprising:
   ceramic particles formed of a ceramic material with a melting point not higher than 2000° C.,
   a log differential pore volume distribution obtained by a mercury porosimetry for the ceramic particles having a peak top of a main peak in a range of 10 μm or less, and
   having a peak top of a second peak located at a fine pore size less than the peak top of the main peak, the ratio (H2/H1) of a height H2 of the second peak to a height H1 of the main peak being 0.05 or less, wherein H1 is based on gaps between the ceramic particles and H2 is based on fine pores on the ceramic particle surface.

2. The thermal spray powder according to claim 1, wherein an average particle size of the ceramic particles is in the range from 1 μm to 20 μm inclusive.

3. The thermal spray powder according to claim 1, wherein the ceramic material includes a halogen element.

* * * * *